(12) United States Patent
Kato et al.

(10) Patent No.: US 11,437,244 B2
(45) Date of Patent: Sep. 6, 2022

(54) DRY ETCHING GAS COMPOSITION AND DRY ETCHING METHOD

(71) Applicant: KANTO DENKA KOGYO CO., LTD., Tokyo (JP)

(72) Inventors: Korehito Kato, Shibukawa (JP); Yoshihiko Iketani, Shibukawa (JP); Yukinobu Shibusawa, Shibukawa (JP); Hisashi Shimizu, Shibukawa (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/489,756

(22) PCT Filed: Apr. 2, 2018

(86) PCT No.: PCT/JP2018/014161
§ 371 (c)(1),
(2) Date: Aug. 29, 2019

(87) PCT Pub. No.: WO2018/186364
PCT Pub. Date: Oct. 11, 2018

(65) Prior Publication Data
US 2020/0234962 A1 Jul. 23, 2020

(30) Foreign Application Priority Data

Apr. 6, 2017 (JP) .............................. JP2017-076019

(51) Int. Cl.
*C09K 13/08* (2006.01)
*H01L 21/3065* (2006.01)

(52) U.S. Cl.
CPC .......... *H01L 21/3065* (2013.01); *C09K 13/08* (2013.01)

(58) Field of Classification Search
CPC ..... C09K 13/08; C09K 13/00; H01L 21/3065; H01L 21/31116; H01L 21/31138; H01L 21/32136
(Continued)

(56) References Cited

U.S. PATENT DOCUMENTS 4,529,476 A 7/1985 Kawamoto et al.
6,784,108 B1 * 8/2004 Donohoe .......... H01L 21/76802
216/67
(Continued)

FOREIGN PATENT DOCUMENTS

CN 101983417 A 3/2011
CN 102089869 A 6/2011
(Continued)

OTHER PUBLICATIONS

International Search Report, dated May 22, 2018, from corresponding PCT application No. PCT/JP2018/014161.
(Continued)

*Primary Examiner* — Lan Vinh
(74) *Attorney, Agent, or Firm* — Nixon & Vanderhye

(57) ABSTRACT

A dry etching gas composition is used which contains a saturated or unsaturated hydrofluorocarbon compound (excluding 1,2,2,3-pentafluorocyclobutane and 1,1,2,2-tetrafluorocyclobutane) represented by a general formula (1):

$C_xH_yF_z$ (where x, y, and z are integers that satisfy $2 \leq x \leq 4$, $y+z \leq 2x+2$, and $0.5 < z/y < 2$). Use of the etching gas composition containing the above-described hydrofluorocarbon makes it possible to selectively etch a nitrogen-containing silicon-based film (b1) with respect to a silicon oxide film, a non-silicon-based mask material, or a polycrystalline silicon film.

20 Claims, 2 Drawing Sheets

(58) Field of Classification Search
USPC ........ 438/700.706, 710, 712, 714, 717, 719, 438/723, 736, 758
See application file for complete search history.

(56) References Cited

U.S. PATENT DOCUMENTS

| | | | |
|---|---|---|---|
| 10,217,681 B1* | 2/2019 | Royer | H01L 21/31116 |
| 2004/0011763 A1 | 1/2004 | Hirose et al. | |
| 2011/0068086 A1 | 3/2011 | Suzuki et al. | |
| 2011/0136345 A1 | 6/2011 | Riva | |
| 2013/0122712 A1* | 5/2013 | Kim | H01L 21/31116 438/714 |
| 2014/0077126 A1* | 3/2014 | Benson | C09K 13/00 252/79.1 |
| 2014/0302683 A1 | 10/2014 | Kikuchi et al. | |
| 2014/0306146 A1 | 10/2014 | Ito et al. | |
| 2015/0294880 A1 | 10/2015 | Anderson et al. | |
| 2015/0357200 A1* | 12/2015 | Inui | H01L 21/31116 438/706 |
| 2015/0371869 A1* | 12/2015 | Surla | H01L 21/31127 438/723 |
| 2016/0218015 A1* | 7/2016 | Oomori | H01L 21/31116 |
| 2017/0103901 A1 | 4/2017 | Shen et al. | |
| 2019/0131140 A1* | 5/2019 | Sun | H01L 21/31122 |

FOREIGN PATENT DOCUMENTS

| | | |
|---|---|---|
| CN | 104871298 A | 8/2015 |
| CN | 104885203 A | 9/2015 |
| CN | 106663624 A | 5/2017 |
| DE | 3420347 A1 | 12/1984 |
| EP | 2304777 A1 | 4/2011 |
| EP | 2 549 526 A1 | 1/2013 |
| EP | 3158579 A1 | 4/2017 |
| JP | S60-115232 A | 6/1985 |
| JP | H7-22149 B2 | 3/1995 |
| JP | 2009-065087 A | 3/2009 |
| JP | 2011-044740 A | 3/2011 |
| JP | 2011-086966 A | 4/2011 |
| JP | 2011-528182 A | 11/2011 |
| JP | 2015-533029 A | 11/2015 |
| JP | 2016-149451 A | 8/2016 |
| JP | 2016-197713 A | 11/2016 |
| JP | 2017-050413 A | 3/2017 |
| JP | 2017-518645 A | 7/2017 |
| KR | 2011-0002017 A | 1/2011 |
| KR | 2011-0051197 A | 5/2011 |
| KR | 2014-0090241 A | 7/2014 |
| KR | 2015-0099515 A | 8/2015 |
| KR | 2017-0020434 A | 2/2017 |
| NL | 8401774 A | 1/1985 |
| TW | 201001531 A | 1/2010 |
| TW | 201606867 A | 2/2016 |
| WO | 2009/123038 A1 | 10/2009 |
| WO | 2010/007064 A1 | 1/2010 |
| WO | 2014/070838 A1 | 5/2014 |
| WO | 2014/104290 A1 | 7/2014 |
| WO | 2015/194178 A1 | 12/2015 |

OTHER PUBLICATIONS

Extended European Search Report issued in European Patent Application No. 18781549.3 dated Nov. 20, 2020.

Omori et al., "Evaluation of etching property in C3HXF(6-X) plasma", 2016 IEEE 16th International Conference on Nanotechnology (IEEE-NANO), IEEE, Aug. 22, 2016, pp. 127-130.

* cited by examiner

DRY ETCHING GAS COMPOSITION AND DRY ETCHING METHOD

BACKGROUND OF THE INVENTION

Field of the Invention

The present invention relates to a dry etching gas composition containing a hydrofluorocarbon gas and a dry etching method using the same.

Description of the Related Art

Currently, in order to realize semiconductor devices that are faster and more power-saving, the miniaturization of semiconductor devices, the use of new materials, and the like are being actively tried. Micromachining of semiconductor devices is performed through dry etching using a fluorocarbon (hereinafter also referred to as "FC") gas or hydrofluorocarbon (hereinafter also referred to as "HFC") gas plasma.

It is commonly known that in an FC gas plasma having with 2 or more carbon atoms and having a cyclic structure or an unsaturated bond, such as $C_4F_8$, $C_4F_6$, or $C_5F_8$, a silicon oxide film (hereinafter also referred to as "(SiOm) (m indicates a natural number)") can be selectively etched with respect to a silicon nitride film (hereinafter also referred to as "SiN"), a polycrystalline silicon (hereinafter also referred to as "Poly-Si"), a resist, or the like (Patent Literatures 1 to 3, for example).

Furthermore, an HFC gas is also known to have an etching effect with regard to a silicon oxide film, a silicon nitride film, or the like.

For example, Patent Literature 4 discloses a plasma etching method that uses a process gas containing a saturated fluorohydrocarbon represented by CxHyFz (where x indicates 3, 4, or 5 and y and z each independently indicate a positive integer and satisfy y>z). This literature states that a silicon nitride film can be selectively etched with respect to a silicon oxide film by using this process gas. Examples in this literature give 2,2-difluoro-n-butane ($C_4H_8F_2$) as a specific example of the process gas.

Moreover, Patent Literature 5 discloses an etching gas containing an unsaturated fluorohydrocarbon represented by CxHyFz (x=3, 4, or 5, y+z≤2x, and y>z), and states that a silicon nitride film laminated on a silicon oxide film or a silicon film can be highly selectively etched by using this etching gas. Examples in this literature give 4-fluoro-1-butene ($C_4H_7F_1$), 2-methyl-3-fluoropropene ($C_4H_7F_1$), and 1,1-difluoro-2-methylpropene ($C_4H_6F_2$) as specific examples of the etching gas.

Patent Literature 6 discloses a fluorine-containing unsaturated hydrocarbon represented by a formula CaFbHc (where a, b, and c each indicate a positive integer and satisfy the relationships 2≤a≤5, c<b≥1, 2a+2>b+c, and b≤a+c, excluding a case where a=3, b=4, and c=2), and states that silicon dioxide and silicon nitride can be etched using this fluorine-containing unsaturated hydrocarbon. Examples thereof use pentafluoropropene ($C_3H_1F_5$).

Patent Literature 7 discloses the use of an etching gas selected from the group consisting of trans-1,1,1,4,4,4-hexafluoro-2-butene ($C_4H_2F_6$), cis-1,1,1,4,4,4-hexafluoro-2-butene ($C_4H_2F_6$), hexafluoroisobutene ($C_4H_2F_6$), trans-1,1,2,2,3,4-hexafluorocyclobutane ($C_4H_2F_6$), 1,1,2,2,3-pentafluorocyclobutane, 1,1,2,2-tetrafluorocyclobutane, and cis-1,1,2,2,3,4-hexafluorocyclobutane ($C_4H_2F_6$). This literature states that a silicon-containing thin film can be selectively etched from an amorphous carbon layer by using these gases.

Patent Literature 8 discloses a dry etching gas composition containing a hydrofluorocarbon gas that is represented by CxHyFz, where x is an integer of 3 to 5, and y+z≤2x and y≤z are satisfied, and that has an unsaturated bond in a molecule, and states that a silicon oxide film or a silicon nitride film can be selectively etched by using this composition as the etching gas. Examples in this literature give 1,1,4,4-tetrafluoro-1,3-butadiene ($C_4H_2F_4$) as a specific example of the hydrofluorocarbon gas.

Patent Literature 9 discloses that a dry etching gas composed of 1,3,3,3-tetrafluoropropene ($C_3H_2F_4$) selectively etches a silicon oxide film or a silicon nitride film.

CITATION LIST

Patent Literatures

Patent Literature 1: US 2004011763A1
Patent Literature 2: JP 2011-44740A
Patent Literature 3: JP 2011-86966A
Patent Literature 4: US 2011068086A1
Patent Literature 5: US 2014306146A1
Patent Literature 6: US 2014302683A1
Patent Literature 7: WO 2014070838A1
Patent Literature 8: JP 2016-149451A
Patent Literature 9: JP 2016-197713A
Patent Literature 10: JP 2016-197713A

SUMMARY OF THE INVENTION

As described above, techniques for selectively etching a silicon nitride film with respect to other films are conventionally known.

However, due to recent circumstances of semiconductor production, there is demand for a technique to selectively etch a silicon nitride film with substantially no damage to, among other films, a silicon oxide film in particular, or to a polycrystalline silicon film, or a non-silicon-based mask material, such as an amorphous carbon film (hereinafter also referred to as "ACL").

The inventors of the present invention have conducted in-depth research to address the above-described problems and consequently have found that an etching gas composition containing a specific hydrofluorocarbon is effective, and thus, the present invention has been accomplished.

Specifically, the present invention provides a dry etching gas composition containing, as an HFC gas, a saturated or unsaturated hydrofluorocarbon compound (excluding 1,1,2,2,3-pentafluorocyclobutane and 1,1,2,2-tetrafluorocyclobutane) represented by a general formula CxHyFz (where x, y, and z are integers that satisfy 2≤x≤4, y+z≤2x+2, and 0.5<z/y<2).

Also, the present invention provides a dry etching method that uses the dry etching gas composition, the method including:

performing plasma etching, using the dry etching gas composition, on a laminated structure in which a silicon oxide film (a1), a non-silicon-based mask material (a2), or a polycrystalline silicon film (a3), and a nitrogen-containing silicon-based film (b1) are laminated, and at least a portion of the nitrogen-containing silicon-based film (b1) is capable of coming into contact with the dry etching composition, to thereby selectively etch the nitrogen-containing silicon-based film (b1).

Advantageous Effects of Invention

Plasma etching using the hydrofluorocarbon gas composition of the present invention eliminates conventional problems, issues, or the like and has the following advantages.

A silicon nitride film is selectively etched with respect to a silicon oxide film, an amorphous carbon film, or a polycrystalline silicon film. This makes it possible to reduce damage by plasma etching to a mask material, such as amorphous carbon or polycrystalline silicon, or an $SiO_2$ layer, and therefore, a deterioration in device characteristics and a reduction in yield can be suppressed.

Conventionally, in order to highly selectively etch a silicon nitride film with respect to an amorphous carbon film, a polycrystalline silicon film, or a silicon oxide film, it is necessary to mix a plurality of FC gases or HFC gases in accordance with the film to be etched, and control the mixing ratio and the like. However, according to the present invention, highly selective etching of the silicon nitride film can be realized by using a specific hydrofluorocarbon alone or as an etching gas composition in which $O_2$ or Ar is added to the specific hydrofluorocarbon.

DESCRIPTION OF THE PREFERRED EMBODIMENTS

Figure 1A:
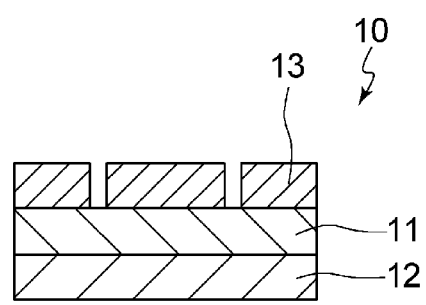
FIGS. 1(a) and 1(b) are diagrams sequentially illustrating steps of a method in which dry etching is performed according to the present invention.

Hereinafter, a dry etching gas composition of the present invention and a dry etching method using the dry etching gas composition will be described in detail. The scope of the present invention is not restricted to that which will be described below, and changes can be made thereto without departing from the gist of the present invention.

A dry etching gas composition of the present invention contains an HFC gas represented by a formula (1) below. In the formula, x, y, and z are integers that satisfy $2 \leq x \leq 4$, $y+z \leq 2x+2$, and $0.5 < z/y < 2$. Note that the formula (1) is a composition formula.

$$C_xH_yF_z \quad (1)$$

The HFC gas represented by the formula (1) may or may not have an unsaturated bond in a molecule. The unsaturated bond is C=C and/or C≡C.

In the present invention, one or two or more HFC gases represented by the formula (1) can be used. The HFC gas represented by the formula (1) may have a chain structure or a cyclic structure. It is preferable that the HFC gas represented by the formula (1) has a chain structure. The chain structure may be a straight chain or a branched chain. A compound having a chain structure will also be referred to as a chain compound.

In the case where the HFC gas represented by the formula (1) has 4 carbon atoms and is a saturated compound, preferable basic frameworks of the HFC gas are as indicated by (4A) to (4C) below:
 C—C—C—C (4A),
 —C—C—C—C— (indicating a four-membered ring structure) (4B), and
 —C—C—(C)—C— (indicating a three-membered ring structure; hereinafter, ( ) indicates a branched structure) (4C).

In the case where the HFC gas represented by the formula (1) has 4 carbon atoms and is an unsaturated compound, preferable basic frameworks of the HFC gas are as indicated by (4a) to (4o) below:
 C=C—C—C (4a),
 C—C=C—C (4b),
 C—C—(C)=C (4c),
 C≡C—C—C (4d),
 C—C≡C—C (4e),
 C=C—C=C (4f),
 C=C=C—C (4g),
 —C—C=C—C— (indicating a four-membered ring structure) (4h),
 —C=C—(C)—C— (indicating a three-membered ring structure) (4i),
 —C=C—(C)—C= (indicating a three-membered ring structure) (4j),
 —C—C=(C)—C— (indicating a three-membered ring structure) (4k),
 C≡C—C=C (4l),
 —C=C—C=C— (indicating a four-membered ring structure) (4m),
 —C—C=(C)—C= (indicating a three-membered ring structure) (4n), and
 C≡C—C≡C (4o).

In the case where the HFC gas represented by the formula (1) has 3 carbon atoms and is a saturated compound, preferable basic frameworks of the HFC gas are as indicated by (3A) and (3B) below:
 C—C—C (3A), and
 —C—C—C— (indicating a three-membered ring structure) (3B).

In the case where the HFC gas represented by the formula (1) has 3 carbon atoms and is an unsaturated compound, preferable basic frameworks of the HFC gas are as indicated by (3a) to (3d) below:
 C=C—C (3a),
 C≡C—C (3b),
 C=C=C (3c), and
 —C=C—C— (indicating a three-membered ring structure) (3d).

In the case where the HFC gas represented by the formula (1) has 2 carbon atoms, preferable basic frameworks of the HFC gas are as indicated by (2A), (2a), and (2b) below:
 C—C (2A),
 C=C (2a), and
 C≡C (2b).

An HFC gas that satisfies $y+z=2x-2$, $y+z=2x$, or $y+z=2x+2$ is preferable as the HFC gas represented by the formula (1). Moreover, in the case where x is 4, it is preferable that y is from 3 to 6, and z is from 3 to 6. In the case where x is 3, it is preferable that y is from 3 to 5, and z is from 3 to 5. In the case where x is 2, it is preferable that y is from 2 to 3, and z is from 2 to 3.

HFC gases listed below are preferable as the HFC gas represented by the formula (1).

HFC gases whose formula (1) is $C_4H_3F_3$, $C_4H_3F_5$, $C_4H_4F_4$, $C_4H_5F_3$, $C_4H_4F_6$, $C_4H_5F_5$, or $C_4H_6F_4$ are preferable as the HFC gases having 4 carbon atoms.

HFC gases whose formula (1) is $C_3H_3F_3$, $C_3H_3F_5$, $C_3H_4F_4$, or $C_3H_5F_3$ are preferable as the HFC gases having 3 carbon atoms.

HFC gases whose formula (1) is $C_2H_3F_3$ or $C_2H_2F_2$ are preferable as the HFC gases having 2 carbon atoms.

Examples of the HFC gas whose formula (1) is $C_4H_3F_3$ include:
1,1,2-trifluoro-1,3-butadiene,
1,1,3-trifluoro-1,3-butadiene,
1,1,4-trifluoro-1,3-butadiene, and
other HFC gases having a cyclic structure.

Examples of the HFC gas whose formula (1) is $C_4H_3F_5$ include:
3,3,4,4,4-pentafluoro-1-butene,
2,3,4,4,4-pentafluoro-1-butene,
1,3,4,4,4-pentafluoro-1-butene,
1,2,4,4,4-pentafluoro-1-butene,
1,1,4,4,4-pentafluoro-1-butene,
2,3,3,4,4-pentafluoro-1-butene,
1,3,3,4,4-pentafluoro-1-butene,
1,2,3,4,4-pentafluoro-1-butene,
1,1,3,4,4-pentafluoro-1-butene,
1,2,3,3,4-pentafluoro-1-butene,
1,1,3,3,4-pentafluoro-1-butene,
1,1,2,3,4-pentafluoro-1-butene, and
other HFC gases having a cyclic structure (excluding 1,1,2,2,3-pentafluorocyclobutane).

Examples of the HFC gas whose formula (1) is $C_4H_4F_4$ or $C_4H_5F_3$ include those having various chain structures or cyclic structures (excluding 1,1,2,2-tetrafluorocyclobutane).

Examples of a specific compound whose formula (1) is $C_4H_4F_6$ include:
1,1,1,4,4,4-hexafluorobutane,
1,1,1,3,4,4-hexafluorobutane,
1,1,1,2,4,4-hexafluorobutane,
1,1,1,3,3,4-hexafluorobutane,
1,1,1,2,3,4-hexafluorobutane,
1,1,1,2,2,4-hexafluorobutane,
1,1,1,2,3,3-hexafluorobutane,
1,1,1,2,2,3-hexafluorobutane,
1,1,2,3,4,4-hexafluorobutane,
1,1,2,2,4,4-hexafluorobutane,
1,1,2,2,3,4-hexafluorobutane,
1,1,2,3,3,4-hexafluorobutane,
1,1,2,2,3,3-hexafluorobutane, and
1,2,2,3,3,4-hexafluorobutane.

Examples of a specific compound whose formula (1) is $C_4H_5F_5$ include:
1,1,1,3,3-pentafluorobutane,
1,1,1,2,3-pentafluorobutane,
1,1,1,2,2-pentafluorobutane,
1,1,1,4,4-pentafluorobutane,
1,1,2,3,4-pentafluorobutane,
1,1,2,3,3-pentafluorobutane,
1,1,2,2,3-pentafluorobutane,
1,1,2,3,4-pentafluorobutane,
1,2,2,3,4-pentafluorobutane, and
1,2,2,3,3-pentafluorobutane.

Examples of the compound whose formula (1) is $C_4H_6F_4$ include those having various straight-chain structures.

Examples of a specific compound whose formula (1) is $C_3H_3F_3$ include:
3,3,3-trifluoro-1-propene,
2,3,3-trifluoro-1-propene,
1,3,3-trifluoro-1-propene,
1,2,3-trifluoro-1-propene,
1,1,3-trifluoro-1-propene,
1,1,2-trifluoro-1-propene, and
other compounds having a cyclic structure.

Examples of the compound whose formula (1) is $C_3H_3F_5$ or $C_3H_4F_4$ include compounds having various straight-chain structures.

Examples of a specific compound whose formula (1) is $C_3H_5F_3$ include:
1,1,1-trifluoropropane,
1,1,2-trifluoropropane,
1,1,3-trifluoropropane,
1,2,3-trifluoropropane, and
1,2,2-trifluoropropane.

Examples of a specific compound whose formula (1) is $C_2H_3F_3$ include:
1,1,1-trifluoroethane, and
1,1,2-trifluoroethane.

Examples of a specific compound whose formula (1) is $C_2H_2F_2$ include:
1,1-difluoroethene,
(E)-1,2-difluoroethene, and
(Z)-1,2-difluoroethene.

Among the above-described compounds, a compound whose formula (1) is at least one selected from $C_4H_3F_3$, $C_4H_3F_5$, $C_4H_4F_6$, $C_4H_5F_5$, $C_3H_3F_3$, $C_3H_5F_3$, and $C_2H_3F_3$ is preferable because such a compound achieves highly effective selective etching of silicon nitride film in the present invention and is easily available.

Moreover, although preferable z/y in the formula (1) is $3/5 \leq z/y \leq 5/3$, in particular, a compound that satisfies $y \leq z$ is preferable in terms of the high plasma resistance of a hydrofluorocarbon film that is to be formed on the surface of each film, and the ease of obtaining a desired processed shape.

Furthermore, a chain compound represented by the formula (1) is preferable because such a compound achieves highly effective selective etching of a silicon nitride film in the present invention, and, in particular, a compound whose basic framework is at least one selected from (4A), (4a), (4f), (3A), (3a), and (2A) above is preferable.

Moreover, it is preferable that a compound represented by the formula (1) has a structure in which a $CF_3$ group or a $CF_2=CF$ group is attached to a terminal, because this makes it easy to realize both selective etching of a silicon nitride film and a high processing speed.

An especially preferable compound is at least one compound selected from 1,1,2-trifluoro-1,3-butadiene, 3,3,4,4,4-pentafluoro-1-butene, 1,1,1,4,4-pentafluorobutane, 1,1,1,4,4,4-hexafluorobutane, 3,3,3-trifluoro-1-propene, 1,1,1-trifluoroethane, and 1,1,2-trifluoroethane. Among these, 1,1,2-trifluoro-1,3-butadiene is preferable in terms of the ease of realizing both selective etching of a silicon nitride film and a desired processed shape.

Many of HFC gases represented by the above-described various structures are known substances and can be produced, and obtained, using conventionally known methods. For example, an HFC gas can be produced, and obtained, using a method described in the Journal of the American Chemical Society, 77, 3640-2 (1955). Moreover, a commercially-available product can be used as-is, or after having been purified if desired.

The etching method of the present invention is a dry etching method that uses plasma, and is performed using a dry etching gas composition containing one or two or more HFC gases represented by the formula (1). In the dry etching gas composition used for etching, a compound represented by the formula (1) is contained in a ratio of preferably 1 to 100 vol %, and more preferably 10 to 30 vol %. In particular, the ratio of the compound represented by the formula (1), in hydrofluorocarbon compounds and fluorocarbon compounds contained in the dry etching gas composition, is preferably 90 vol % or greater, more preferably 99 vol % or greater, and even more preferably 99.999 vol % or greater.

When the ratio of the compound represented by the formula (1) is within the above-described range, the effects of the present invention can be increased even further. In particular, it is preferable that as a compound represented by the formula (1), the ratio of at least one compound selected from 1,1,2-trifluoro-1,3-butadiene, 3,3,4,4,4-pentafluoro-1-butene, 1,1,1,4,4-pentafluorobutane, 1,1,1,4,4,4-hexafluorobutane, 3,3,3-trifluoro-1-propene, 1,1,1-trifluoroethane, and 1,1,2-trifluoroethane satisfies the above-described preferable ratio with respect to the total amount of hydrofluorocarbons and fluorocarbons.

It is preferable that the etching gas composition for use in the plasma etching method of the present invention contains, in addition to the HFC gas represented by the formula (1), at least one compound having an oxygen atom selected from the group consisting of $O_2$, $O_3$, CO, $CO_2$, NO, $NO_2$, $SO_2$, and $SO_3$. In particular, it is more preferable to use $O_2$ among the group of compounds having an oxygen atom. The ratio of the group of compounds having an oxygen atom in the etching gas composition is preferably from 5 to 80 vol %, and more preferably from 5 to 60 vol %.

Moreover, it is preferable that the etching gas composition contains, in addition to the HFC gas represented by the formula (1) and in addition to, or instead of, the above-described compound having an oxygen atom, at least one inert gas selected from the group consisting of $N_2$, He, Ar, Ne, and Xe. In particular, it is more preferable to use Ar among the inert gas group.

The ratio of the HFC gas represented by the formula (1) mixed in the etching gas composition is preferably within a range of 1 to 100 vol %. The ratio of the gas selected from the group of compounds having an oxygen atom, the group consisting of $O_2$, $O_3$, CO, $CO_2$, NO, $NO_2$, $SO_2$, and $SO_3$, is preferably within a range of 1 to 80 vol %. Moreover, the ratio of the gas selected from the inert gas group consisting of $N_2$, He, Ar, Ne, and Xe is preferably within a range of 1 to 80 vol %. In particular, in the case where $O_2$ is used, the effects of the present invention can be increased even further by mixing the HFC gas represented by the formula (1) in a ratio of 5 to 50 vol % and $O_2$ in a ratio of 5 to 80 vol %.

Plasma etching of the present invention is performed at a pressure preferably within a range of 0.01 to 100 Pa, and more preferably within a range of 0.1 to 10 Pa.

Any apparatus that is known in the art can be used as a plasma etching apparatus without limitation. For example, a helicon wave type, a high-frequency induction type, a parallel-plate type, a magnetron type, a microwave type, and other apparatuses can be used.

Although the plasma density is not particularly limited, it is desirable to perform etching in a high-density plasma atmosphere of $10^8$ ions/cm$^3$ or greater, and more preferably $10^8$ to $10^{13}$ ions/cm$^3$.

An example of an object to be subjected to plasma etching is a laminated structure in which a silicon oxide film (a1), a non-silicon-based mask material (a2), or a polycrystalline silicon film (a3), and a nitrogen-containing silicon-based film (b1) are laminated. Examples of the nitrogen-containing silicon-based film (b1) include a silicon nitride film, an SiON film, an SiCN film, and an SiOCN film, and a silicon nitride film is particularly preferable in terms of the high etching selectivity with respect to the silicon oxide film (a1), the non-silicon-based mask material (a2), or the polycrystalline silicon film (a3). Moreover, the non-silicon-based mask material (a2) may be either of an organic film containing carbon as the main component and an inorganic film. Examples of the organic film containing carbon as the main component include an amorphous carbon film and a photoresist. An example of the inorganic film is a titanium nitride film.

As shown in FIG. 1(a), the film (b1) (hereinafter referred to as a "first layer 11") may be used as a surface to be etched. Alternatively, as shown in FIG. 2(a), any of the films (a1) to (a3) (hereinafter referred to as a "second layer 12") may be used as a surface to be etched.

Figure 1B:
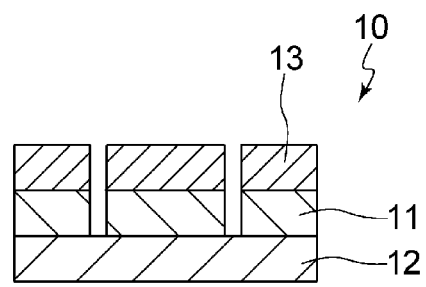

In the case of the form shown in FIG. 1(a), a mask 13 in which a predetermined pattern is formed is disposed on the surface of the first layer 11 of a laminated structure 10, and dry etching is performed from the mask 13 side. In this laminated structure, at least a portion of the first layer 11, which is the nitrogen-containing silicon-based film (b1), is capable of coming into contact with the dry etching composition containing the HFC gas represented by the formula (1). As shown in FIG. 1(b), the HFC gas represented by the formula (1) selectively etches the first layer 11, and the etching proceeds to the surface of the second layer 12 that is located under the first layer 11. Since the HFC gas represented by the formula (1) does not etch the second layer 12, the etching stops at the time when the surface of the second layer 12 is exposed.

Figure 2A:
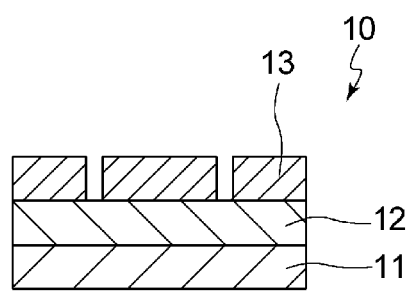
FIGS. 2(a) to 2(c) are diagrams sequentially illustrating steps of another method in which dry etching is performed according to the present invention.
Figure 2B:
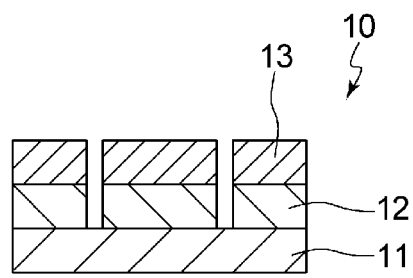
Figure 2C:
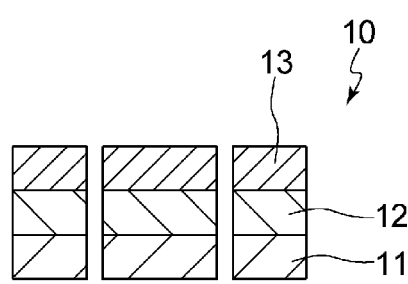

In the case of the form shown in FIG. 2(a), the mask 13 in which a predetermined pattern is formed is disposed on the surface of the second layer 12 of a laminated structure 10, and the second layer 12 is selectively etched as shown in FIG. 2(b) using a gas that is capable of selectively etching the second layer 12. Thus, at least a portion of the first layer 11 is capable of coming into contact with the dry etching composition containing the HFC gas represented by the formula (1). Subsequently, as shown in FIG. 2(c), the first layer 11 is selectively etched using the HFC gas represented by the formula (1). At this time, the second layer 12 is not etched. In the forms shown in FIGS. 1 and 2, the mask 13 may be composed of any of (a1) to (a3), or may be formed of another material that is not etched by the compound represented by the formula (1). Alternatively, it is also possible that the laminated structure is composed of only the mask 13 formed of any of (a1) to (a3) and the first layer 11 and does not have the second layer 12.

Moreover, in the forms shown in FIGS. 1 and 2, the mask 13 may be composed of any of (a1) to (a3), and the second layer 12 be formed of another material that is other than (a1) to (a3) and that is not etched by the compound represented by the formula (1). Additionally, or alternatively, in the structural laminates shown in FIGS. 1 and 2, a layer other than the mask 13, the first layer 11, and the second layer 12 may also be laminated.

In all of the forms shown in FIGS. 1 and 2, it is preferable that ions or radicals having 2 to 4 carbon atoms generated by making the etching gas composition into a plasma are used for etching, because this enables highly selective etching.

With regard to the plasma conditions that can generate such ions, for example, in the case where 1,1,2-trifluoro-1,3-butadiene is used as the HFC gas, the ratio of 1,1,2-trifluoro-1,3-butadiene is within a range of 10 to 20 vol %, the ratio of $O_2$ is within a range of 20 to 60 vol %, and the ratio of Ar is within a range of 30 to 70 vol %.

Moreover, for example, in the case where 3,3,4,4,4-pentafluoro-1-butene is used as the HFC gas, the ratio of 3,3,4,4,4-pentafluoro-1-butene is within a range of 10 to 20 vol %, the ratio of $O_2$ is within a range of 20 to 50 vol %, and the ratio of Ar is within a range of 40 to 70 vol %.

Moreover, for example, in the case where 1,1,1,4,4,4-hexafluorobutane is used as the HFC gas, the ratio of 1,1,1,4,4,4-hexafluorobutane is within a range of 10 to 30 vol %, the ratio of $O_2$ is within a range of 10 to 30 vol %, and the ratio of Ar is within a range of 45 to 75 vol %.

Moreover, for example, in the case where 1,1,1,4,4-pentafluorobutane is used as the HFC gas, the ratio of 1,1,1,4,4-pentafluorobutane is within a range of 10 to 30 vol %, the ratio of $O_2$ is within a range of 5 to 30 vol %, and the ratio of Ar is within a range of 50 to 80 vol %.

Moreover, for example, in the case where 3,3,3-trifluoro-1-propene is used as the HFC gas, the ratio of 3,3,3-trifluoro-1-propene is within a range of 10 to 30 vol %, the ratio of $O_2$ is within a range of 5 to 35 vol %, and the ratio of Ar is within a range of 40 to 80 vol %.

Moreover, for example, in the case where 1,1,1-trifluoroethane or 1,1,2-trifluoroethane is used as the HFC gas, the ratio of 1,1,1-trifluoroethane or 1,1,2-trifluoroethane is within a range of 10 to 30 vol %, the ratio of $O_2$ is within a range of 0 to 30 vol %, and the ratio of Ar is within a range of 50 to 90 vol %.

In all of the cases where the above-described HFC compounds are used, with regard to conditions of the pressure and the RF power, conditions that can generate ions and radicals having 1 to 5 carbon atoms, or preferably 2 to 4 carbon atoms, under the above-described gas composition conditions can be adopted. For example, conditions of 1 to 10 Pa of pressure and 300 W of RF power can be adopted.

EXAMPLES

Hereinafter, the present invention will be described in greater detail using examples and comparative examples. However, the present invention is not limited to these examples.

In the examples of the present invention, a parallel-plate type capacitive coupling plasma etching apparatus was used as the plasma etching apparatus. An $SiO_2$ film with a thickness of 1,000 nm that was deposited on a silicon wafer through plasma CVD was used as a silicon oxide film (SiOm) (m indicates a natural number). An SiN film with a thickness of 300 nm that was deposited on a silicon wafer through thermal CVD was used as a silicon nitride film (SiN) serving as a nitrogen-containing silicon-based film. A Poly-Si film with a thickness of 300 nm that was deposited, through plasma CVD, on an $SiO_2$ film with a thickness of 100 nm deposited on a silicon wafer was used as a polycrystalline silicon film. An ACL film with a thickness of 400 nm that was deposited on a silicon wafer through plasma CVD was used as an amorphous carbon film.

With regard to the measurement of an etching rate in plasma etching, the etching rate was calculated according to a formula below.

$$\text{Etching rate (nm/min)} = \frac{\text{Sample film thickness prior to eching (nm)} - \text{Sample film thickness after etching(nm)}}{\text{Etching time(min)}} \quad \text{Mathematical Formula 1}$$

The film thickness of a sample was measured using an optical interference film thickness meter.

Examples 1 to 9 and Comparative Examples 1 to 5

Dry etching gas compositions in which etching gases shown in Table 1, $O_2$, and Ar were mixed according to compositions shown in Table 1 were used. A plasma was generated under the conditions of 10 Pa of pressure and 300 W of RF power, and samples of the $SiO_2$ film, the SiN film, the Poly-Si film, and the ACL film were etched. The etching rates of the samples were as shown in Table 1. Table 1 shows selectivity ratios that were calculated according to a formula below using the etching rates of the samples.

$$\text{Selectivity ratio} = \frac{\text{Etching rate of film with respect to which selectivity ratio is to be obtained}}{\text{Etching time of another film}} \quad \text{Mathematical Formula 2}$$

The sources of the etching gases used in the examples are given below. However, the present invention is not limited to the methods for obtaining or producing the etching gases below.

$C_4H_3F_3$ (1,1,2-trifluoro-1,3-butadiene): produced using the method described in the Journal of the American Chemical Society, 77, 3640-2 (1955).

$C_4H_3F_5$ (3,3,4,4,4-pentafluoro-1-butene): purchased from SynQuest Labs, Inc.

$C_4H_5F_5$ (1,1,1,4,4-pentafluorobutane): purchased from SynQuest Labs, Inc.

$C_4H_4F_6$ (1,1,1,4,4,4-hexafluorobutane): produced using a method described in the Polish Journal of Chemistry, 52, 71 (1978).

$C_3H_3F_3$ (3,3,3-trifluoro-1-propene): purchased from SynQuest Labs, Inc.

$C_2H_3F_3$ (1,1,1-trifluoroethane): purchased from SynQuest Labs, Inc.

$C_2H_3F_3$ (1,1,2-trifluoroethane): purchased from SynQuest Labs, Inc.

TABLE 1

|  | | Gas composition | | | | | |
|---|---|---|---|---|---|---|---|
|  | Etching gas | Etching gas [vol %] | $O_2$ [vol %] | Ar [vol %] | Film to be etched | Etching rate [nm/min] | SiN film selectivity |
| Ex. 1 | $C_4H_3F_3$ | 13.3 | 53.3 | 33.3 | $SiO_2$ film | 0.0 | ∞ |
|  |  |  |  |  | SiN film | 71.2 |  |
|  |  |  |  |  | Poly-Si film | 0.0 | ∞ |
|  |  |  |  |  | ACL film | 0.0 | ∞ |
| Ex. 2 |  | 13.8 | 51.7 | 34.5 | $SiO_2$ film | 0.0 | ∞ |
|  |  |  |  |  | SiN film | 13.1 |  |
|  |  |  |  |  | Poly-Si film | 0.0 | ∞ |
|  |  |  |  |  | ACL film | 0.0 | ∞ |

TABLE 1-continued

| | Etching gas | Gas composition | | | Film to be etched | Etching rate [nm/min] | SiN film selectivity |
|---|---|---|---|---|---|---|---|
| | | Etching gas [vol %] | O$_2$ [vol %] | Ar [vol %] | | | |
| Ex. 3 | C$_4$H$_3$F$_5$ | 17.4 | 39.1 | 43.5 | SiO$_2$ film | 0.0 | ∞ |
| | | | | | SiN film | 21.7 | |
| | | | | | Poly-Si film | 0.0 | ∞ |
| | | | | | ACL film | 0.0 | ∞ |
| Ex. 4 | C$_4$H$_5$F$_5$ | 22.2 | 22.2 | 55.6 | SiO$_2$ film | 0.0 | ∞ |
| | | | | | SiN film | 117.4 | |
| | | | | | Poly-Si film | 0.0 | ∞ |
| | | | | | ACL film | 0.0 | ∞ |
| Ex. 5 | C$_4$H$_4$F$_6$ | 21.7 | 23.9 | 54.3 | SiO$_2$ film | 0.0 | ∞ |
| | | | | | SiN film | 46.9 | |
| | | | | | Poly-Si film | 0.0 | ∞ |
| | | | | | ACL film | 0.0 | ∞ |
| Ex. 6 | C$_3$H$_3$F$_3$ | 21.1 | 26.3 | 52.6 | SiO$_2$ film | 0.0 | ∞ |
| | | | | | SiN film | 41.2 | |
| | | | | | Poly-Si film | 0.0 | ∞ |
| | | | | | ACL film | 0.0 | ∞ |
| Ex. 7 | C$_2$H$_3$F$_3$ (1,1,1-trifluoroethane) | 25.0 | 12.5 | 62.5 | SiO$_2$ film | 0.0 | ∞ |
| | | | | | SiN film | 132.3 | |
| | | | | | Poly-Si film | 0.0 | ∞ |
| | | | | | ACL film | 0.0 | ∞ |
| Ex. 8 | C$_2$H$_3$F$_3$ (1,1,2-trifluoroethane) | 25.0 | 12.5 | 62.5 | SiO$_2$ film | 0.0 | ∞ |
| | | | | | SiN film | 30.1 | |
| | | | | | Poly-Si film | 0.0 | ∞ |
| | | | | | ACL film | 0.0 | ∞ |
| Com. Ex. 1 | C$_4$H$_2$F$_4$ | 13.3 | 53.3 | 33.3 | SiO$_2$ film | 30.6 | 0.6 |
| | | | | | SiN film | 17.4 | |
| | | | | | Poly-Si film | 1.1 | 15.8 |
| | | | | | ACL film | 0.0 | ∞ |
| Com. Ex. 2 | C$_4$H$_2$F$_6$ | 20.0 | 30.0 | 50.0 | SiO$_2$ film | 55.1 | 0.9 |
| | | | | | SiN film | 49.7 | |
| | | | | | Poly-Si film | 9.8 | 5.1 |
| | | | | | ACL film | 4.5 | 11.1 |
| Com. Ex. 3 | C$_4$H$_2$F$_8$ | 22.2 | 22.2 | 55.6 | SiO$_2$ film | 71.1 | 1.8 |
| | | | | | SiN film | 124.9 | |
| | | | | | Poly-Si film | 39.3 | 3.2 |
| | | | | | ACL film | 24.4 | 5.1 |
| Com. Ex. 4 | C$_3$HF$_5$ | 22.2 | 22.2 | 55.6 | SiO$_2$ film | 64.0 | 1.0 |
| | | | | | SiN film | 62.1 | |
| | | | | | Poly-Si film | 14.8 | 4.2 |
| | | | | | ACL film | 13.0 | 4.8 |
| Com. Ex. 5 | C$_2$H$_2$F$_4$ | 25.0 | 12.5 | 62.5 | SiO$_2$ film | 66.1 | 1.3 |
| | | | | | SiN film | 86.8 | |
| | | | | | Poly-Si film | 6.6 | 13.1 |
| | | | | | ACL film | 6.4 | 13.7 |

As shown in Table 1, in all of Examples 1 to 8, only the SiN film, of the SiO$_2$ film, the SiN film, the poly-Si film, and the ACL film, was etched, and the selectivity of the SiN film with respect to the other films was infinite. Therefore, it was shown that an etching gas composition containing a compound represented by the formula (1) enables highly selective etching of an SiN film with respect to an SiO$_2$ film, a Poly-Si film, and an ACL film.

Moreover, a comparison of the results of the examples with the results of Comparative Examples 1 to 5 showed that, compared with the existing etching gases, etching that uses an etching gas composition containing a compound represented by the formula (1) enables even more selective etching of the nitrogen-containing silicon-based film (b1) with respect to the silicon oxide film (a1), the non-silicon-based mask material (a2), and the polycrystalline silicon film (a3).

INDUSTRIAL APPLICABILITY

With the etching gas composition containing the HFC gas represented by the formula (1), a silicon nitride film can be highly selectively etched with respect to the other films. Thus, the etching gas composition can be used in micromachining in which, in a laminated structure constituted by a mask material such as polycrystalline silicon or amorphous carbon, or a silicon oxide film or the like, and a silicon nitride film, the silicon nitride film is to be selectively etched.

The invention claimed is:
1. A dry etching method that uses a dry etching gas composition,
wherein the dry etching gas composition contains at least one hydrocarbon compound selected from the group consisting of 1,1,2-trifluoro-1,3-butadiene, 3,3,4,4,4-pentafluoro-1-butene, and 1,1,1-trifluoroethane,
the method comprising:
performing plasma etching, using the dry etching gas composition, on a laminated structure in which a silicon oxide film (a1), a non-silicon-based mask material (a2), or a polycrystalline silicon film (a3), and a nitrogen-containing silicon-based film (b1) are laminated, and at least a portion of the nitrogen-containing silicon-based film (b1) is capable of coming into contact with the dry etching composition, to thereby selectively etch the nitrogen-containing silicon-based film (b1) with respect to the silicon oxide film (a1), the non-silicon-based mask material (a2), or the polycrystalline silicon film (a3).

2. The dry etching method as set forth in claim 1, wherein the nitrogen-containing silicon-based film (b1) is a silicon nitride film.

3. The dry etching method as set forth in claim 1, wherein the non-silicon-based mask material (a2) is an amorphous carbon film, a photoresist, or a titanium nitride film.

4. The dry etching method as set forth in claim 1, wherein the dry etching gas composition contains at least one hydrocarbon compound selected from the group consisting of 1,1,2-trifluoro-1,3-butadiene and 3,3,4,4-pentafluoro-1-butene.

5. The dry etching method as set forth in claim 1, wherein the dry etching gas composition contains at least one hydrocarbon compound selected from the group consisting of 1,1,2-trifluoro-1,3-butadiene and 1,1,1-trifluoroethane.

6. The dry etching method as set forth in claim 1, wherein the dry etching gas composition contains, in addition to the hydrofluorocarbon compound, at least one inert gas selected from the group consisting of $N_2$, He, Ar, Ne, and Xe.

7. The dry etching method as set forth in claim 6, wherein the nitrogen-containing silicon-based film (b1) is a silicon nitride film.

8. The dry etching method as set forth in claim 6, wherein the non-silicon-based mask material (a2) is an amorphous carbon film, a photoresist, or a titanium nitride film.

9. The dry etching method as set forth in claim 1, wherein the dry etching gas composition contains, in addition to the hydrofluorocarbon compound, at least one compound having an oxygen atom selected from the group consisting of $O_2$, $O_3$, CO, $CO_2$, NO, $NO_2$, $SO_2$, and $SO_3$.

10. The dry etching method as set forth in claim 9, wherein the dry etching gas composition contains, in addition to the hydrofluorocarbon compound, at least one inert gas selected from the group consisting of $N_2$, He, Ar, Ne, and Xe.

11. The dry etching method as set forth in claim 9, wherein the nitrogen-containing silicon-based film (b1) is a silicon nitride film.

12. The dry etching method as set forth in claim 9, wherein the non-silicon-based mask material (a2) is an amorphous carbon film, a photoresist, or a titanium nitride film.

13. The dry etching method as set forth in claim 1, wherein the hydrofluorocarbon compound is contained in the dry etching gas composition in a ratio from 1 to 100 vol %.

14. The dry etching method as set forth in claim 13, wherein the dry etching gas composition contains, in addition to the hydrofluorocarbon compound, at least one compound having an oxygen atom selected from the group consisting of $O_2$, $O_3$, CO, $CO_2$, NO, $NO_2$, $SO_2$, and $SO_3$.

15. The dry etching method as set forth in claim 13, wherein the dry etching gas composition contains, in addition to the hydrofluorocarbon compound, at least one inert gas selected from the group consisting of $N_2$, He, Ar, Ne, and Xe.

16. The dry etching method as set forth in claim 13, wherein the nitrogen-containing silicon-based film (b1) is a silicon nitride film.

17. The dry etching method as set forth in claim 13, wherein the non-silicon-based mask material (a2) is an amorphous carbon film, a photoresist, or a titanium nitride film.

18. A dry etching method that uses a dry etching gas composition,
wherein the dry etching gas composition contains a compound that is a linear compound and is represented by $C_4H_3F_3$, $C_4H_3F_5$, or $C_4H_4F_4$, or contains 1,1,1,4,4-pentafluorobutane,
the method comprising:
performing plasma etching, using the dry etching gas composition, on a laminated structure in which a silicon oxide film (a1) and a nitrogen-containing silicon-based film (b1) are laminated, and at least a portion of the nitrogen-containing silicon-based film (b1) is capable of coming into contact with the dry etching composition, to thereby selectively etch the nitrogen-containing silicon-based film (b1) with respect to the silicon oxide film (a1).

19. The dry etching method as set forth in claim 18, wherein the dry etching gas composition contains a compound that is a linear compound and is represented by $C_4H_3F_3$ or $C_4H_4F_4$, or contains 1,1,1,4,4-pentafluorobutane.

20. A dry etching method that uses a dry etching gas composition, said method comprising:
performing plasma etching, using the dry etching gas composition, on a laminated structure in which a silicon oxide film (a1) and a nitrogen-containing silicon-based film (b1) are laminated, and at least a portion of the nitrogen-containing silicon-based film (b1) is capable of coming into contact with the dry etching composition, to thereby selectively etch the nitrogen-containing silicon-based film (b1) with respect to the silicon oxide film (a1), wherein the dry etching gas composition contains 21.7 to 30 vol % of 1,1,1,4,4,4-hexafluorobutane.

* * * * *